United States Patent
Pirk et al.

(10) Patent No.: US 10,504,809 B2
(45) Date of Patent: Dec. 10, 2019

(54) METHOD FOR PRODUCING AN ELECTRICAL DEVICE COMPRISING A COVERING MATERIAL

(71) Applicant: Robert Bosch GmbH, Stuttgart (DE)

(72) Inventors: Tjalf Pirk, Stuttgart (DE); Helmut Schmidt, Bietigheim-Bissingen (DE); Petra Stedile, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/775,345

(22) PCT Filed: Nov. 17, 2016

(86) PCT No.: PCT/EP2016/077924
§ 371 (c)(1),
(2) Date: May 10, 2018

(87) PCT Pub. No.: WO2017/089210
PCT Pub. Date: Jun. 1, 2017

(65) Prior Publication Data
US 2018/0331006 A1    Nov. 15, 2018

(30) Foreign Application Priority Data

Nov. 26, 2015  (DE) .................. 10 2015 223 439

(51) Int. Cl.
*H01L 23/29*     (2006.01)
*H01L 23/31*     (2006.01)
(Continued)

(52) U.S. Cl.
CPC ............ *H01L 23/291* (2013.01); *H01L 21/56* (2013.01); *H01L 23/29* (2013.01);
(Continued)

(58) Field of Classification Search
CPC ..... H01L 23/3135; H01L 21/56; H01L 23/29; H01L 23/564; C04B 28/06; Y10T 428/249968
See application file for complete search history.

(56) References Cited

U.S. PATENT DOCUMENTS 2,491,487 A    12/1949  Faulwetter
2008/0017999 A1    1/2008  Kikuchi et al.
(Continued)

FOREIGN PATENT DOCUMENTS

DE    10 2013 112 267 A1    5/2015

OTHER PUBLICATIONS

International Search Report corresponding to PCT Application No. PCT/EP2016/077924, dated Jan. 23, 2017 (German and English language document) (5 pages).

*Primary Examiner* — Charles D Garber
*Assistant Examiner* — Alia Sabur
(74) *Attorney, Agent, or Firm* — Maginot, Moore & Beck LLP

(57) ABSTRACT

A method for producing an electrical device including an electrical component at least partially covered by a covering material having a cement material includes supplying the cement material, mixing an additive into the cement material, applying the covering material having the cement material with the additive onto the electrical component, and treating the covering material. The treatment allows the additive from the cement material to reach a surface of the cement material and to form a protective layer on the surface.

13 Claims, 1 Drawing Sheet

(51) Int. Cl.
    *H01L 23/00*     (2006.01)
    *H01L 21/56*     (2006.01)

(52) U.S. Cl.
    CPC ...... *H01L 23/3135* (2013.01); *H01L 23/3157* (2013.01); *H01L 23/564* (2013.01)

(56) References Cited

U.S. PATENT DOCUMENTS

| | | |
|---|---|---|
| 2009/0028237 A1 | 1/2009 | Yang |
| 2009/0258237 A1 | 10/2009 | Choi et al. |
| 2012/0263940 A1 | 10/2012 | Arzberger et al. |
| 2015/0076524 A1 | 3/2015 | Muranaka et al. |
| 2016/0152522 A1* | 6/2016 | Wurmli ................ C04B 28/14 428/414 |
| 2016/0260648 A1* | 9/2016 | Eisele ................ H01L 23/291 |
| 2017/0092597 A1* | 3/2017 | Jeng ................ H01L 21/02164 |

* cited by examiner

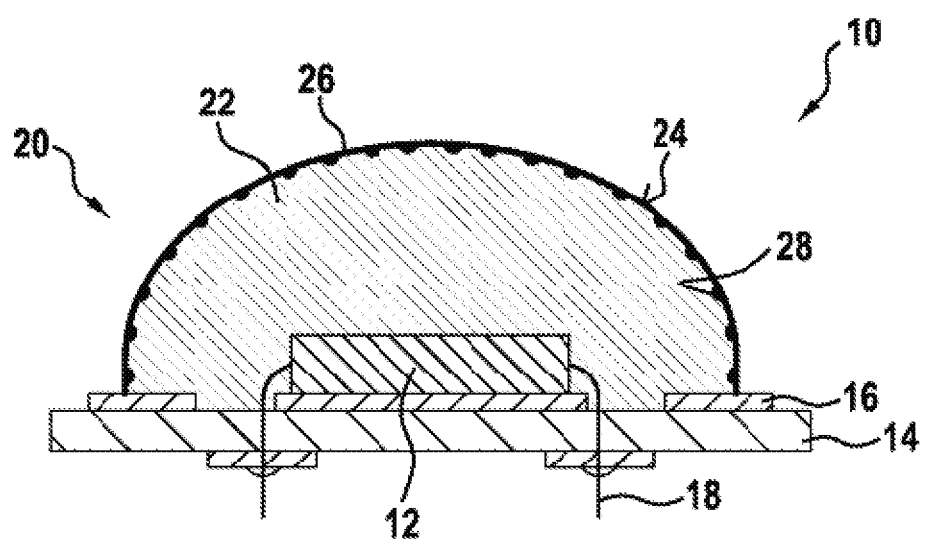

METHOD FOR PRODUCING AN ELECTRICAL DEVICE COMPRISING A COVERING MATERIAL

This application is a 35 U.S.C. § 371 National Stage Application of PCT/EP2016/077924, filed on Nov. 17, 2016, which claims the benefit of priority to Serial No. DE 10 2015 223 439.8, filed on Nov. 26, 2015 in Germany, the disclosures of which are incorporated herein by reference in their entirety.

The present disclosure relates to a method of producing an electrical device having an electrical component at least partly enveloped by an envelope material, and to an electrical device of this kind.

BACKGROUND

It is extremely important nowadays to increase the reliability and efficiency and lower the costs of high-performance electronic modules and robust sensor systems. The current envelope materials (epoxy compounds, silicone materials) are limited to a temperature range below 200° C. The opening-up of the temperature range of up to 300° C. or 350° C. for envelope materials can extend the operating range of modern high-performance semiconductors SiC) beyond. 200° C. without having to dispense with the added function of an envelope material (e.g. protection from environmental effects, improved thermal properties).

DE102013112267A1 discloses a semiconductor module having an envelope material composed of different types of cement that covers a semiconductor unit. This envelope material includes a moisture-resistant protective layer which is applied in a separate manufacturing step after the cement material has set.

SUMMARY

The present disclosure provides a method of producing an electrical device having an electrical component at least partly enveloped by an envelope material including a cement material, having the following steps:
  providing the cement material;
  mixing an admixture into the cement material;
  applying the envelope material including the cement material comprising the admixture to the electrical component in such a way that the electrical component is at least partly enveloped by the envelope material; and
  treating the envelope material, wherein the treatment causes the admixture from the cement material to arrive at a surface of the cement material and to form a protective layer at this surface.

The present disclosure further provides an electrical device having an electrical component at least partly enveloped by an envelope material including a cement material, wherein a protective layer is disposed at a surface of the cement material, wherein the protective layer includes an admixture which has arrived from the interior of the cement material at the surface of the cement material, which resulted in formation of the protective layer at this surface.

The present disclosure also provides for the use of an admixture for formation of a protective layer on an envelope material including a cement material in an electrical component of an electrical device, wherein the admixture arrives at a surface of the cement material by virtue of a treatment of the envelope material and forms the protective layer at this surface.

The electrical component may, for example, be a semiconductor component, a sensor element, an inductance, a capacitance, a battery cell, a battery module or a whole circuit. However, an electrical component in the context of the present disclosure may be understood to mean any active and passive component or high-performance component. The electrical device here may have a carrier substrate on which the electrical component is disposed.

A cement in the context of the present disclosure may be understood to mean an inorganic, metal-free, hydraulic binder. The cement hardens here in a hydraulic manner, meaning that a chemical reaction with water takes place to form stable, insoluble compounds. At the start of the process or prior to the hydration, the cement may have been in the form of a finely ground powder, which reacts with water or added water to form hydrates, solidifies and hardens. The hydrates here may form needles and/or platelets, which intermesh and hence lead to a high strength of the cement. By contrast, a phosphate cement does not harden in a hydraulic manner. An acid-base reaction takes place to form a salt gel, which solidifies at a later stage to give a usually amorphous material. In the acid-base reaction, $H^+$ (hydrogen ions) are exchanged.

The cement may consist predominantly of calcium aluminates, and may form calcium aluminate hydrates during the hydration. It is advantageous when the cement material includes calcium aluminate cement, and especially consists of calcium aluminate cement. Calcium aluminate cement (abbreviation: CAC) is subject to the European standard DIN EN 14647. Calcium aluminate cement consists predominantly of monocalcium aluminate (CaO* Al2O3)

The calcium aluminate cement may have, for example, the following composition:
  Al2O3: not less than 67.8% by weight
  CaO: not more than 31.0% by weight
  SiO2: not more than 0.8% by weight
  Fe2O3: not more than 0.4% by weight An admixture in the context of the present disclosure may be understood to mean an additive or a layer former. The admixture may be in pulverulent form prior to the step of mixing it into the cement material. However, the admixture may also have a liquid component. Accordingly, the admixture may be in the form of a solution or dispersion or suspension, for example with a water content. Ideally, the admixture has been mixed into or dissolved in the makeup water. The admixture may be mixed into a dry cement material or cement powder mixture, i.e. before any added water is mixed in. The admixture can alternatively be mixed into the wet cement material or cement powder mixture, i.e. after any added water has been added.

An envelope material in the context of the present disclosure may be understood to mean any type of encapsulation (packaging). The envelope material may take the form of a cement composite. In other words, the envelope material may include a cement matrix comprising a filler and the admixture. Before and/or after the step of treatment, the envelope material may have the following composition:
  calcium aluminate cement binder: not less than 8% by weight to not more than 47% by weight (for example SECAR 71)
  water reactant: not less than 10% by weight to not more than 28% by weight
  admixture: 3-20% by weight
  filler: not less than 25% by weight to not more than 82% by weight The filler may be selected from the group consisting of:
Al2O3: fine d50 about 1 μm to coarse d50 about 150-200 μm
alpha-Si3N4: fine about 1 μm to coarse about 100 μm
hex. EN: fine about 15 μm or up to about 250 μm
SiC: fine about 10-50 μm or up to about 600 μm
AlN: fine about 1 μm or up to about 100 μm The step of treatment may comprise a multitude of component steps. The step of treatment may comprise a hydration step and/or setting step and/or drying step and/or curing step. The step of treatment may also include a waiting step in order, for example, to wait for a "spontaneous" process or allow it to proceed. The step of treatment can "drive" the admixture out of the interior of the cement material to a surface of the envelope material. However, the step of treatment can also be delayed until the admixture further arrives from the interior of the cement material at the surface of the envelope material without ado. The step of treatment can also trigger the admixture to form a protective layer at this surface.

The method of the disclosure now makes it possible, by addition of a suitable admixture to the cement material, advantageously to additionally create a protective layer at the surface of the cement material on or during the treatment of the envelope material, i.e. in one and the same manufacturing step. In other words, for example, in the setting or drying of the envelope material, a kind of skin formation is caused, which closes the pores of the cement material at the surface and improves the mechanical properties and imperviousness properties of the envelope material. Accordingly, the additional operating step of coating the cement material after the application on the electrical component is firstly dispensed with entirely. Secondly, the protective layer can already display its protective function during the treatment of the envelope material and not just thereafter.

It is also advantageous when the protective layer is water vapor-impermeable. Accordingly, the protective layer takes the form of a vapor barrier layer or impervious layer. The water-impermeable protective layer or vapor barrier layer on the material surface of the cement material prevents water from evaporating or evaporating off from the cement material during the hydration process and/or setting process and/or drying process and/or curing process, which means that the water/cement value remains constant. The water/cement value is critical for the material properties, for which reason it has to be set exactly and must also remain very substantially constant. This is because, on the one hand, the effect of too little water is that the cement grain core is not fully hydrated. As a result, on later contact with water, cracks can arise in the hard envelope material owing to volume expansion caused by subsequent hydration of the cement grain core, which can destroy the structure of the envelope material. On the other hand, too much water leads to formation of capillary pores by the excess water, which increases the porosity of the envelope material and consequently reduces the imperviousness. Thus, the water vapor-impermeable protective layer according to the disclosure, which forms in or during the step of treatment of the envelope material, can advantageously keep the cement/water ratio constant in the course of crystallization of the cement material. Moreover, the water vapor-impermeable protective layer assures the imperviousness of the envelope material even after the completion of the electrical device, i.e. during the operation of the electrical device. Since, however, the envelope material has fine residual porosity even with the optimal water/cement ratio, the water vapor-impermeable protective layer, after the setting, offers additional sealing and hence optimal protection from moisture for the envelope material.

It is also advantageous when the step of treatment of the envelope material comprises at least one of the following treatments:
subjecting the envelope material to vibration, agitation movements and/or spinning movements;
heat-treating the envelope material;
exposing the envelope material in a defined gas atmosphere;
subjecting the envelope material to a defined pressure;
subjecting the envelope material to electromagnetic radiation of a defined wavelength and intensity, for example UV radiation, infrared radiation, visible light.

By subjecting the envelope material to vibration, agitation movements and/or spinning movements, the admixture can be separated from the mixture in a very simple manner in order thus to arrive at the surface.

The heat treatment may comprise a tempering step in a tempering oven. The heat treatment can be effected within a temperature range from not less than 40° C. to not less equal than 300° C.

The gas atmosphere may take the form, for example, of the atmosphere or air having an elevated air humidity of up to 100%. The gas atmosphere may also include catalyst or accelerator molecules.

By virtue of this measure, the parameters for activation of the functionality of the admixture can be adjusted in a simple manner, such that the admixture can arrive reliably and efficiently at the surface of the cement material and the protective layer can form at this surface.

In addition, it is advantageous when the step of treating the envelope material causes the admixture to float up and/or to diffuse to the surface of the cement material and/or to coagulate and/or to swell up. In this case, the admixture can float up to the surface of the cement material in the liquid cement material during a gelation phase. The admixture can alternatively or additionally also diffuse to the surface of the cement material by virtue of a particle size gradient and/or a density gradient in the cement material during a drying phase. However, the admixture can alternatively or additionally also coagulate up to the surface of the cement material owing to its concentration and form lumps there. In addition, the admixture can alternatively or additionally also swell up to the surface of the cement material as a result of a reaction. It is especially advantageous when the admixture swells up to the surface of the cement material, polymerizes and cures to form the protective layer. Accordingly, the admixture may be in such a form that it reacts on contact with a particular atmosphere (ambient air, oxygen, tempering oven atmosphere) and/or under other boundary conditions (temperature, UV irradiation, pH). Particular preference is given to materials which float up on the cement slip and combine rapidly to form a layer, analogously to an oil film on a water surface. Also possible are dissolved polymers which form a film. By virtue of this measure, the admixture can easily arrive at the surfaces in order to form the protective layer there or combine to form the protective layer.

It is also advantageous when the admixture is selected from the group consisting of: monomers, polymers, especially silicone, and inorganic substances, especially oxides, nitrides, ceramics. In this case, the materials selected must be such as to withstand the required temperatures in the treatment or in the tempering and optionally in operation in a stable manner. The admixture may especially include or consist of a water-soluble polymer, e.g. vinyl alcohol or mixtures thereof. These materials or groups of materials have high thermal stability and are thus of particularly good suitability for the adjustment or increase in the imperviousness properties of the envelope material.

In addition, it is advantageous when the following additional step is conducted: mixing a binder and/or swellant into the cement material, i.e. before the application of the cement material to the electrical component, in order to keep the admixture at the surface of the cement material in the step of treating the envelope material. By virtue of this measure, the admixture remains "fixed" at the surface during the treatment, and so it is possible to optimize layer formation and further improve the imperviousness properties.

It is also advantageous when the admixture is also disposed in the interior of the cement material. In this case, it is also possible for lust traces of the admixture to be present in the cement material. By virtue of an "excess" of admixture in the cement material, after the layer has formed, a certain residual content remains in the cement material, which ensures that the initial amount of admixture was sufficient for the formation of the preferably continuous protective layer.

It is also advantageous when the protective layer has been formed so as to break down or to carbonate at a particular temperature, especially in a region of not less than 250'C. In other words, the protective layer has been envisaged only for the "critical phase", namely the drying and curing process, in order to maintain the cement/water ratio in the crystallization, and dissolves in a controlled manner thereafter. This offers the advantage that a very thin protective layer, which is thus also easy to implement, and which does not have to offer prolonged imperviousness, is sufficient. For this application, preference is given to monomers and polymers substances.

BRIEF DESCRIPTION OF THE DRAWINGS

The disclosure is elucidated in detail by way of example hereinafter with reference to the appended drawing. The drawing shows:

FIG. 1 a diagram of an electrical device in one working example of the present disclosure.

DETAILED DESCRIPTION

FIG. 1 shows an inventive electrical device which, in its entirety, has been given the reference numeral 10.

The electrical device 10 has an electrical component 12. The electrical component 12 takes the form of a semiconductor component 12. The electrical component 12 has been arranged on a carrier substrate 14. A copper layer 16 has been arranged between the electrical component 12 and the carrier substrate 14. The copper layer 16 here has multiple functions, namely that of improving the intake and removal of heat, providing a means of electrical contacting for the electrical component 12, and if necessary of acting as a flow barrier to the envelope material on application.

The electrical component 12 is connected via bonding wires 18 to the opposite side of the carrier substrate 14 therefrom, which enables electrical contacting of the electrical component 12 from the outside. In this case, the carrier substrate 14 may take the form, for example, of a plate into which conductor tracks or electrical contacts for contacting of the electrical component 12 may also be integrated. The conductor tracks may also be arranged on a surface of the carrier substrate 14. The carrier substrate 14 may be designed to form a chip.

The electrical device 10 also includes an envelope material 20 including a cement material 22. The envelope material 20 or the cement material 22 takes the form of a glob top. The envelope material 20 or the cement material is disposed on the carrier substrate 14. The cement material 22 here envelops the electrical component 12 on the surfaces not covered by the carrier substrate 14. Accordingly, the electrical component 12 is fully enveloped by the carrier substrate 14 and the envelope material 20. The cement material 22 additionally also covers a part of the carrier substrate 14 via which it is firmly bonded to the carrier substrate 14.

The envelope material 20 or the cement material 22 has a surface 24 at which a protective layer 26 is disposed. According to the disclosure, the protective layer 26 includes an admixture 28. The admixture 28 has arrived here from the interior of the cement material 22 at the surface 24 of the cement material 22 as a result of or during the treatment of the envelope material 24, especially in the setting of the cement material 22. This may have occurred, for example, as a result of floating and/or diffusion and/or coagulation and/or swelling of the admixture 28 up to the surface 24 of the cement material 22. By virtue of the accumulation and hardening of the admixture 28 at the surface 24, the protective layer 26 has then formed in accordance with the disclosure. The protective layer 26 here is preferably in vapor-impermeable form, in order to keep the water/cement value constant during the curing process.

In the production of the electrical device 10, first of all, the cement material 22 is provided, for example in powder form. The admixture 28, which may also, for example, be in pulverulent form, is then mixed into the cement material 22. Subsequently, a liquid component, for example water, is mixed in together with, optionally, the Melflux flux. The moist envelope material 20 including the cement material 22, the admixture 28 and the water is then evacuated, applied to the electrical component 12 and brought into shape, for example by means of injection molding or casting in molds. Subsequently, the envelope material 20 is treated, especially heat-treated or tempered, for example at 60° C. and 90% relative humidity, which results in gel formation, crystallization, needling and curing of the cement material 22. In this case, the air humidity prevents any loss of water (water/cement value), and the temperature brings about formation of the desired structures. In the course of or during gel formation until curing, the protective layer 26 is formed in accordance with the disclosure at the surface 24 of the cement material 22, in the course of which the admixture 28 from the interior of the envelope material 20 applied arrives at the surface 24 of the cement material 22, for example floats up and/or diffuses and/or coagulates and/or swells up, and hardens there. Finally, the envelope material 20 is optionally treated with the protective layer 26, then demolded and subjected to aging treatment, for example at 300° C.

The invention claimed is:

1. A method of producing an electrical device including an electrical component at least partly enveloped by an envelope material having a cement material, the method comprising:

mixing an admixture into the cement material;

applying the envelope material including the cement material comprising the admixture to the electrical component; and treating the envelope material so as to cause the admixture from the cement material to arrive at a surface of the cement material and to form a protective layer at the surface.

2. The method as claimed in claim 1, wherein the cement material includes calcium aluminate cement.

3. The method as claimed in claim 1, wherein the protective layer is water vapor-impermeable.

4. The method as claimed in claim 1, wherein treating the envelope material comprises at least one of the following treatments:
   subjecting the envelope material to vibration, agitation movements and/or spinning movements;
   heat-treating the envelope material;
   exposing the envelope material in a defined gas atmosphere;
   subjecting the envelope material to a defined pressure; and
   subjecting the envelope material to electromagnetic radiation.

5. The method as claimed in claim 1, wherein treating the envelope material causes the admixture to float up and/or to diffuse and/or to coagulate and/or to swell up to the surface of the cement material.

6. The method as claimed in claim 5, wherein the admixture:
   floats up to the surface of the cement material in the liquid cement material during a gelation phase; and/or
   diffuses to the surface of the cement material via a particle size gradient and/or a density gradient in the cement material during a drying phase; and/or
   coagulates based on its concentration; and/or
   swells up as a result of a reaction.

7. The method as claimed in claim 5, wherein the admixture swells up to the surface of the cement material, polymerizes, and cures to form the protective layer.

8. The method as claimed in claim 1, wherein the admixture is selected from the group consisting of monomers, polymers, silicone, inorganic substances, oxides, nitride, and ceramics.

9. The method as claimed in claim 1, wherein treating the envelope material comprises:
   mixing a binder and/or a swellant into the cement material in order to keep the admixture at the surface of the cement material.

10. An electrical device, comprising:
    an envelope material including a cement material;
    an electrical component at least partly enveloped by the envelope material; and
    a protective layer disposed at a surface of the cement material and including an admixture configured to arrive from an interior of the cement material at the surface of the cement material so as to form the protective layer at the surface,
    wherein the admixture is also disposed in the interior of the cement material.

11. The electrical device as claimed in claim 10, wherein the admixture is further configured to be mixed into the cement material and to float and/or diffuse out of the interior of the cement material to the surface of the cement material, and/or coagulate and/or swell so as to form the protective layer at the surface.

12. The electrical device as claimed in claim 10, wherein the protective layer is configured to break down or to carbonate at a particular temperature not less than 250° C.

13. The electrical device as claimed in claim 10, wherein the electrical component is a semiconductor component, a sensor element, an inductance, a capacitance, a battery cell, a battery module, or a circuit.

* * * * *